(12) United States Patent
Nishimura et al.

(10) Patent No.: US 8,872,139 B2
(45) Date of Patent: Oct. 28, 2014

(54) SETTLING TIME ACQUISITION METHOD

(71) Applicant: NuFlare Technology, Inc., Yokohama (JP)

(72) Inventors: Rieko Nishimura, Kanagawa (JP); Michihiro Sakai, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/211,782

(22) Filed: Mar. 14, 2014

(65) Prior Publication Data
US 2014/0284500 A1    Sep. 25, 2014

(30) Foreign Application Priority Data
Mar. 21, 2013    (JP) .................................. 2013-058125

(51) Int. Cl.
  *H01J 37/00*    (2006.01)
  *H01J 37/147*    (2006.01)
  *H01J 37/304*    (2006.01)
  *G21K 5/10*    (2006.01)
  *H01J 37/317*    (2006.01)

(52) U.S. Cl.
  CPC .................................. *H01J 37/3174* (2013.01)
  USPC ................. 250/492.22; 250/492.2; 250/492.3; 250/491.1; 250/396 R; 250/252.1

(58) Field of Classification Search
  CPC .................. H01J 37/3174; H01J 2237/31776; H01J 37/3026; H01J 2237/31764; H01J 37/3023
  USPC ........ 250/492.22, 492.2, 492.3, 491.1, 396 R, 250/252.1
  See application file for complete search history.

(56) References Cited

U.S. PATENT DOCUMENTS

| 8,076,649 B2 * | 12/2011 | Sakai et al. ................ 250/396 R |
| 8,178,856 B2 * | 5/2012 | Nakayamada et al. .. 250/492.22 |
| 8,748,064 B2 * | 6/2014 | Nishimura et al. ................ 430/5 |
| 2013/0264499 A1 * | 10/2013 | Nishimura ............... 250/492.22 |
| 2014/0054469 A1 * | 2/2014 | Nishimura .................... 250/400 |

FOREIGN PATENT DOCUMENTS

JP    2010-74039    4/2010

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A settling time acquisition method includes writing at least one reference pattern formed by at least one shot of a charged particle beam, writing an evaluation pattern, which has been formed by combination of the first and second shots of a charged particle beam shaped to first and second patterns of different sizes and whose width size is the same as that of the reference pattern, while changing, concerning beam shaping of the second shot, a settling time of a DAC amplifier, wherein writing is performed for each settling time, measuring the width size of the reference pattern, measuring the width size of the evaluation pattern for each settling time, calculating, for each settling time, a difference between the width sizes of the reference and evaluation patterns, and acquiring a settling time from each settling time of the DAC amplifier when the difference is not exceeding a threshold value.

10 Claims, 8 Drawing Sheets

SETTLING TIME ACQUISITION METHOD

CROSS-REFERENCE TO RELATED APPLICATION

This application is based upon and claims the benefit of priority from the prior Japanese Patent Application No. 2013-058125 filed on Mar. 21, 2013 in Japan, the entire contents of which are incorporated herein by reference.

BACKGROUND OF THE INVENTION

1. Field of the Invention

The present invention relates to a settling time acquisition method. More specifically, it relates to a method of acquiring a settling time of a deflection amplifier for electron beam shaping deflection in an electron beam writing apparatus.

2. Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

Figure 10:
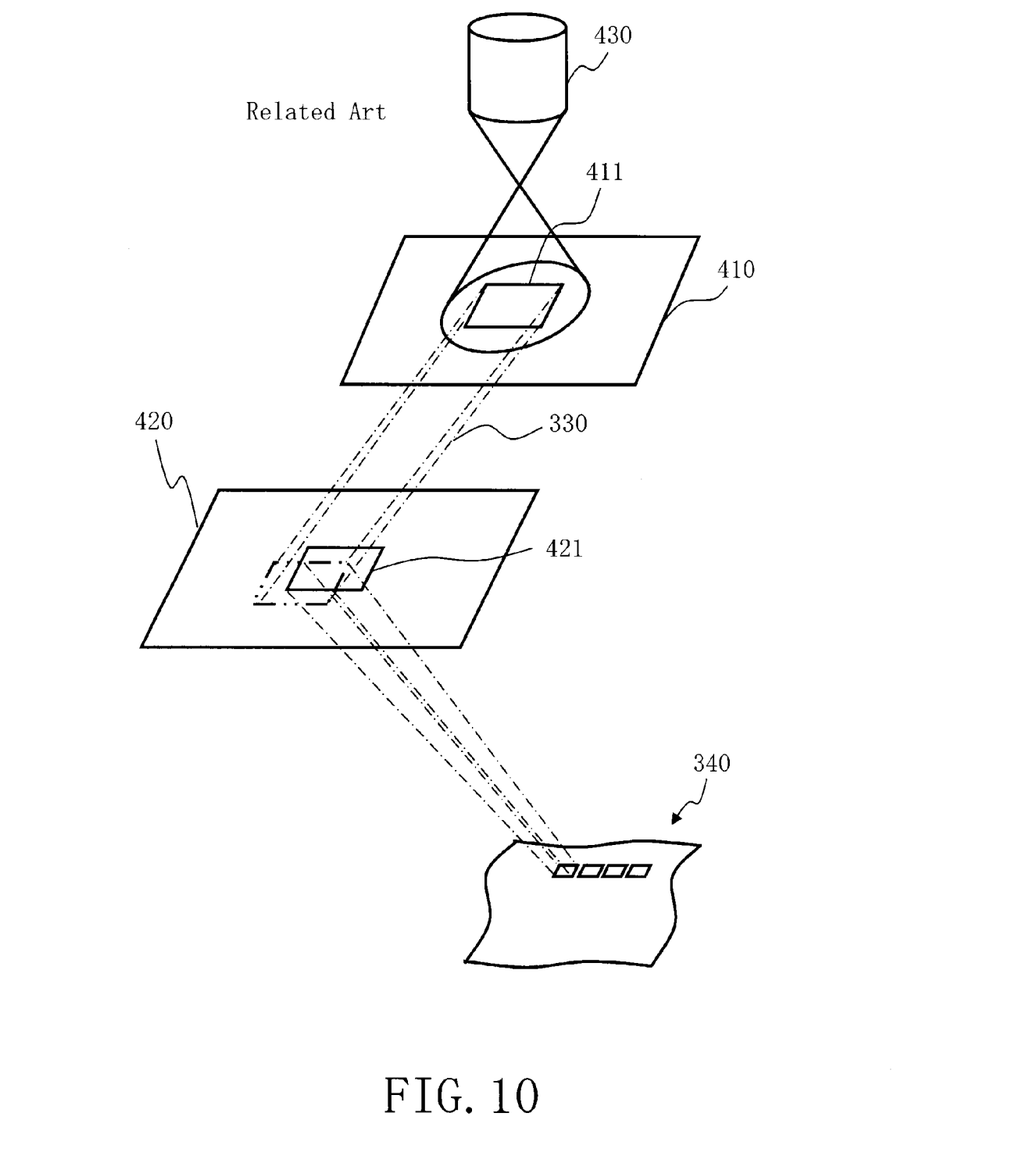
FIG. 10 is a conceptual diagram for explaining operations of a variable shaped electron beam writing or "drawing" apparatus.

FIG. 10 is a conceptual diagram for explaining operations of a variable shaped electron beam writing or "drawing" apparatus. The variable shaped electron beam writing apparatus operates as described below. A first aperture 410 has a quadrangular opening 411 for shaping an electron beam 330. A second aperture 420 has a variable-shape opening 421 for shaping the electron beam 330 having passed through the opening 411 of the first aperture 410 into a desired quadrangular shape. The electron beam 330 emitted from a charged particle source 430 and having passed through the opening 411 is deflected by a deflector to pass through a part of the variable-shape opening 421 of the second aperture 420, and thereby to irradiate a target object or "sample" 340 placed on a stage which continuously moves in one predetermined direction (e.g., the X direction) during the writing. In other words, a quadrangular shape that can pass through both the opening 411 and the variable-shape opening 421 is used for pattern writing in a writing region of the target object 340 on the stage continuously moving in the X direction. This method of forming a given shape by letting beams pass through both the opening 411 of the first aperture 410 and the variable-shape opening 421 of the second aperture 420 is referred to as a variable shaped beam (VSB) system.

When performing writing in a writing apparatus, a charged particle beam such as an electron beam is deflected by a deflector, where a DAC (digital/analog converter) amplifier is used for deflecting the beam. Beam deflection using the DAC amplifier serves, for example, for controlling the shape and size of a beam shot, controlling the position of a beam shot, and blanking of a beam. For performing the beam deflection, it is necessary to set the settling time of a DAC amplifier required to accurately execute deflection of a set displacement amount. If a settling time is insufficient, an error occurs in the deflection movement amount. If a settling time is too long, the throughput degrades. Therefore, it is desirable to set a settling time as short as possible within the range where no error occurs.

With high accuracy and miniaturization of a circuit pattern typified by semiconductor devices in recent years, high accuracy and high throughput are also needed for the electron beam writing apparatus. Conventionally, optimization of a settling time with respect to beam deflection for controlling a shot position has attracted attention, wherein is performed to measure a writing position with a position measuring device and set a settling time within the range which can be measured by the position measuring device and in which no positional deviation is generated (refer to, e.g., Japanese Patent Application Laid-open (JP-A) No. 2010-074039). In connection with the high accuracy and high throughput, deflection regions and shaping beam maximum shot sizes have been miniaturized. Moreover, figure sizes have also been miniaturized due to the miniaturization of patterns. Therefore, it has become required to optimize and accurately set a settling time in shaping deflection, which has not been much focused, especially in changing a figure size.

BRIEF SUMMARY OF THE INVENTION

In accordance with one aspect of the present invention, a settling time acquisition method includes writing, on a target object, at least one reference pattern formed by at least one shot of a charged particle beam having been shaped by using a first shaping aperture, a second shaping aperture, and a deflector for deflecting the charged particle beam passing between the first shaping aperture and the second shaping aperture; writing, on the target object, an evaluation pattern, which has been formed by a combination of two shots of a first shot and a second shot of a charged particle beam having been shaped to a first pattern and a second pattern of different sizes by using the first shaping aperture, the second shaping aperture, and the deflector, and whose pattern width size after being resolved is a same in design as that of the reference pattern, while changing, with respect to beam shaping of the second shot, a settling time of a DAC (digital/analogue converter) amplifier for controlling the deflector, wherein the writing is performed for each of the settling time; measuring a pattern width size of the reference pattern; measuring the pattern width size of the evaluation pattern for the each of the settling time; calculating, for the each of the settling time, a difference between the pattern width size of the reference pattern and the pattern width size of the evaluation pattern; and acquiring a settling time from the each of the settling time of the DAC amplifier in a case where the difference is less than or equal to a threshold value.

In accordance with another aspect of the present invention, a settling time acquisition method includes writing, on a target object, at least one reference pattern formed by one shot of a charged particle beam having been shaped to a pattern of a first pattern width size by using a first shaping aperture, a second shaping aperture, and a deflector for deflecting a charged particle beam passing between the first shaping aperture and the second shaping aperture; writing, on the target object, an evaluation pattern which has been formed by overlapping a first shot of a charged particle beam having been shaped to a pattern of a second pattern width size less than a resolution limit and a second shot of a charged particle beam having been shaped to a pattern of the first pattern width size by using the first shaping aperture, the second shaping aperture, and the deflector while changing, with respect to beam shaping of the second shot, a settling time of a DAC (digital/analogue converter) amplifier for controlling the deflector, wherein the writing is performed for each of the settling time; measuring a pattern width size of the reference pattern; measuring a pattern width size of the evaluation pattern for the each of the settling time; calculating, for the each of the settling time, a difference between the pattern width size of the reference pattern and the pattern width size of the evaluation pattern; and acquiring a settling time from the each of the settling time of the DAC amplifier in a case where the difference is less than or equal to a threshold value.

DETAILED DESCRIPTION OF THE INVENTION

In the following embodiment, there will be described a method for obtaining a suitable settling time in shaping deflection of changing a figure size.

In the following embodiment, there will be described a configuration in which an electron beam is used as an example of a charged particle beam. The charged particle beam is not limited to the electron beam, and other charged particle beam such as an ion beam may also be used. Moreover, a variable shaped beam type writing apparatus will be described as an example of a charged particle beam apparatus.

First Embodiment

Figure 1:
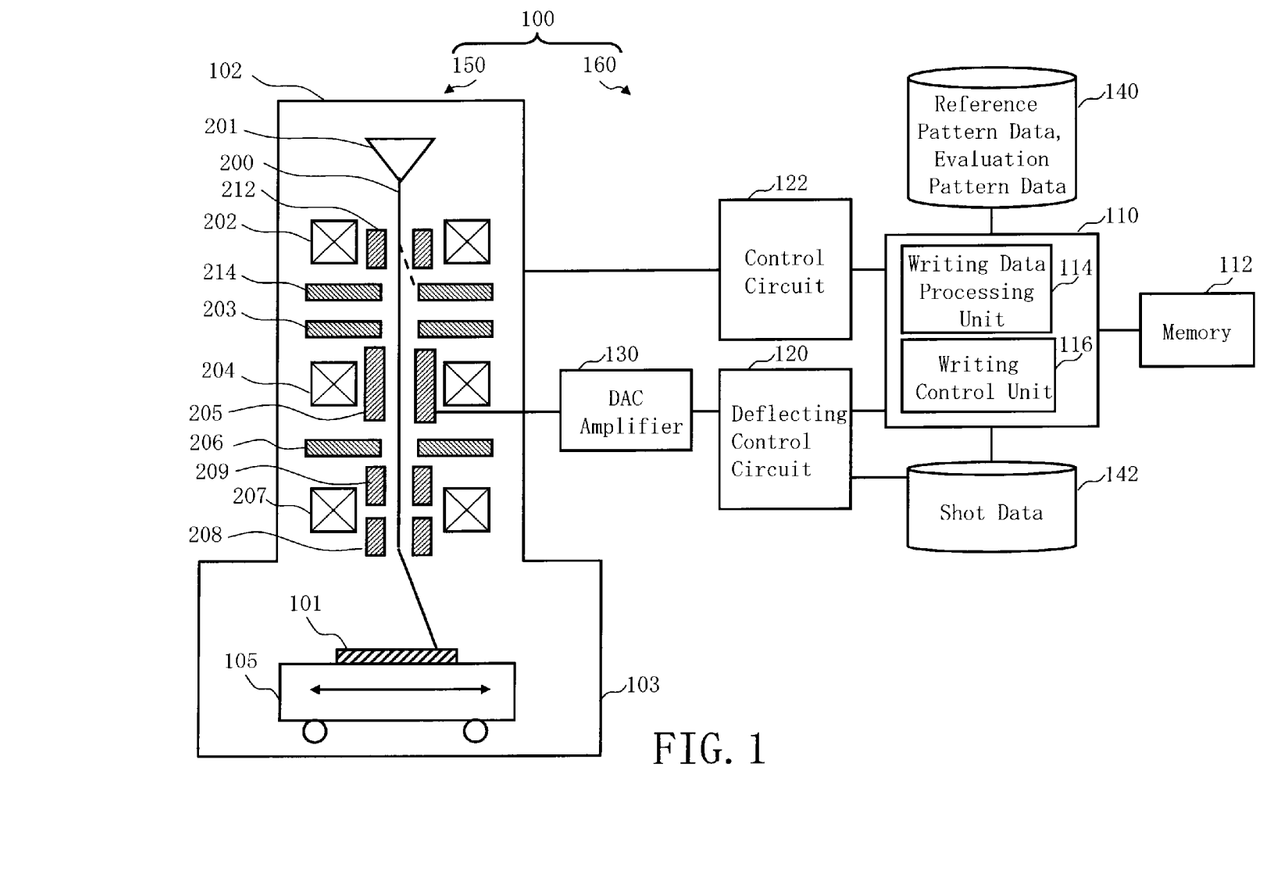
FIG. 1 is a schematic diagram showing a configuration of a writing apparatus according to the first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, is an example of a variable shaped beam (VSB) type writing apparatus. The writing unit 150 includes an electron lens barrel 102 and a writing chamber 103. In the electron lens barrel 102, there are arranged an electron gun assembly 201, an illumination lens 202, a blanking deflector 212, a blanking aperture 214, a first aperture 203, a projection lens 204, a deflector 205, a second aperture 206, an objective lens 207, a main deflector 208, and a sub deflector 209. In the writing chamber 103, there is arranged an XY stage 105, on which a target object or "sample" 101 such as a mask serving as a writing target substrate is placed when performing writing. The target object 101 is, for example, an exposure mask used for manufacturing semiconductor devices. The target object 101 may be, for example, a mask blank on which a light-shielding film of such as chromium (Cr) is formed on the glass substrate, resist is applied on the light-shielding film and no pattern has yet been formed.

The control unit 160 includes a control computer 110, a memory 112, a deflection control circuit 120, a control circuit 122, a DAC (digital/analog converter) amplifier 130, and storage devices 140 and 142 such as magnetic disk drives. The control computer 110, the memory 112, the deflection control circuit 120, the control circuit 122, and the storage devices 140 and 142 are mutually connected through a bus (not shown).

In the control computer 110, there are arranged a writing data processing unit 114 and a writing control unit 116. Each function, such as the writing data processing unit 114 and the writing control unit 116 may be configured by hardware such as an electronic circuit or by software such as a program causing a computer to implement these functions. Alternatively, it may be configured by a combination of hardware and software. Data which is input and output to/from the writing data processing unit 114 and the writing control unit 116 and data being calculated are stored in the memory 112 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Moreover, input devices, such as a mouse and a keyboard, a monitoring device, an external interface circuit, etc. may be connected to the writing apparatus 100.

The deflector 205 for shaping deflection is composed of four or more electrodes so that deflection in the X and Y directions may be performed. The DAC amplifier 130 is provided for each electrode.

Figure 2:
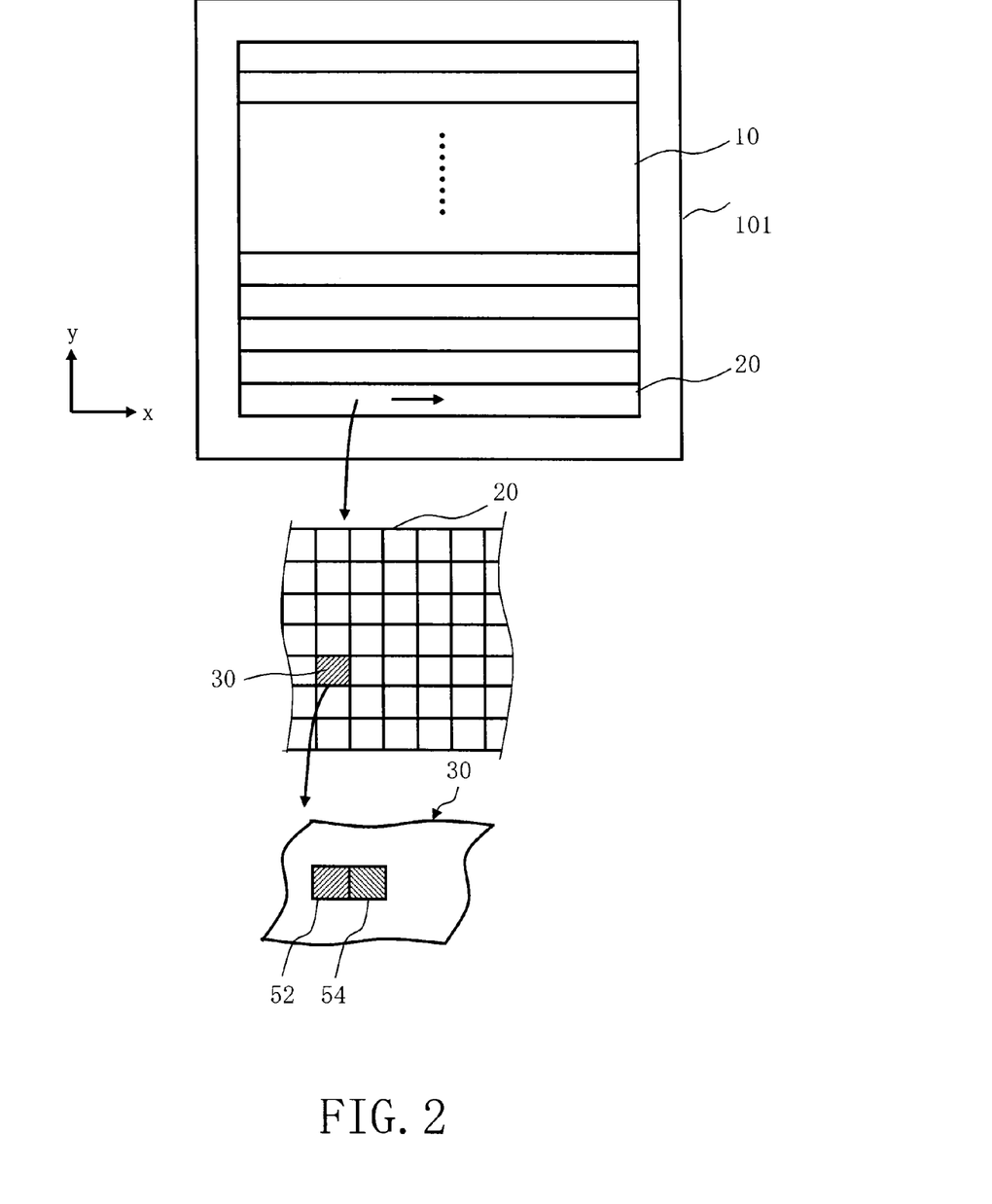
FIG. 2 is a conceptual diagram for explaining each region according to the first Embodiment.

FIG. 2 is a conceptual diagram for explaining each region according to the first Embodiment. In FIG. 2, a writing region 10 of the target object 101 is virtually divided into a plurality of strip-shaped stripe regions 20 in the Y direction, for example, each having a width deflectable by the main deflector 208. Further, each stripe region 20 is virtually divided into a plurality of mesh-like subfields (SFs) 30 (small regions) each having a size deflectable by the sub deflector 209. Patterns 52 and 54 being shot figures are written at corresponding shot positions in each SF 30.

A digital signal for blanking control is output from the deflection control circuit 120 to a DAC amplifier (not shown) for blanking control. Then, in the DAC amplifier for blanking control, the digital signal is converted to an analog signal, and amplified to be applied as a deflection voltage to the blanking deflector 212. An electron beam 200 is deflected by this deflection voltage in order to form each beam shot.

A digital signal for shaping deflection control is output from the deflection control circuit 120 to the DAC amplifier 130 for shaping deflection control. Then, in the DAC amplifier 130 for shaping deflection control, the digital signal is converted to an analog signal and amplified to be applied as a deflection voltage to the deflector 205 for shaping deflection. By this deflection voltage, the electron beam 200 having passed through the first aperture 203 is deflected so as to passing through the second aperture 206, thereby forming each beam shot whose figure type and figure size are variable.

A digital signal for main deflection control is output from the deflection control circuit 120 to a DAC amplifier (not shown) for main deflection position control. Then, in the DAC amplifier for main deflection position control, the digital signal is converted to an analog signal and amplified to be applied as a deflection voltage to the main deflector 208. The electron beam 200 is deflected by this deflection voltage, and thereby each beam shot is deflected to a reference position in a predetermined subfield (SF) 30 among virtually divided mesh like subfields 30.

A digital signal for sub-deflection control is output from the deflection control circuit 120 to a DAC amplifier (not shown) for sub-deflection position control. Then, in the DAC amplifier for sub-deflection position control, the digital signal is converted to an analog signal and amplified to be applied as a deflection voltage to the sub deflector 209. The electron beam 200 is deflected by this deflection voltage, and thereby each beam shot is deflected to a shot position in a predetermined subfield (SF) among virtually divided mesh like subfields.

The writing apparatus 100 performs writing processing in each stripe region 20 while changing the figure size of the electron beam 200, by using the deflector 205, the first aperture 203, and the second aperture 206. Writing is performed by deflecting a shaped electron beam 200 to the target object, using a multiple stage deflector for position control. In this case, a two-stage deflector composed of the main deflector 208 and the sub deflector 209 is used as an example. While the XY stage 105 is continuously moving in the −X direction, for example, writing is performed in the X direction with respect to the first stripe region 20. After completing writing to the first stripe region 20, writing is performed similarly or in the opposite direction, to the second stripe region 20. Then, in the same way, writing is carried out to the third and subsequent stripe regions 20. The main deflector 208 deflects the electron beam 200 in sequence to a reference position A in the SF 30 so as to follow the movement of the XY stage 105. The sub deflector 209 deflects the electron beam 200 from the reference position A in each SF 30 to each shot position of an irradiating beam in the SF 30 concerned. Thus, the sizes of the deflection regions of the main deflector 208 and the sub deflector 209 are different from each other. The SF 30 is the smallest deflection region in the deflection regions of the multiple stage deflector.

In the first embodiment, there will be described with a focus on a method of obtaining an optimum settling time to be set in the DAC amplifier 130 for deflector 205 which deflects the electron beam 200 so that the figure size may be changed when shaping a beam. If a beam deflection amount (displacement amount) is large, the settling time becomes long in connection with it. Therefore, if the settling time is uniquely set in accordance with the maximum size change amount, it takes an unnecessary time in the case of changing a size smaller than the maximum one. With miniaturization of figure sizes due to recent miniaturization of patterns, the number of quadrangles is increasing as a figure type to be shaped. Moreover, changing the size of each quadrangle for each shot is becoming increased. Therefore, by changing the settling time to an optimized settling time for each shot in accordance with a size change amount (beam displacement amount), it becomes possible to remove an unnecessary settling time. Accordingly, in the first embodiment, there will be described a method of obtaining an optimum settling time in accordance with a size change amount (beam displacement amount).

Figure 3A:
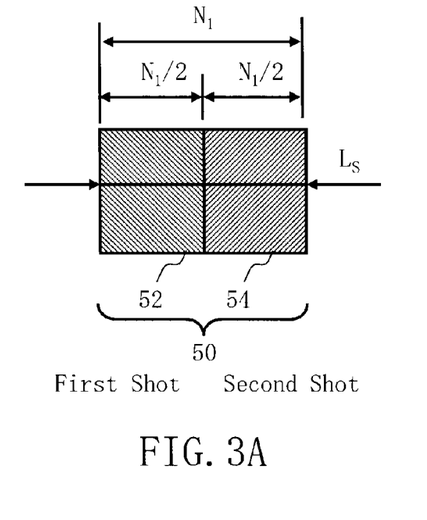
FIGS. 3A and 3B show examples of a reference pattern and an evaluation pattern for obtaining an optimum settling time in the case of a size change amount being small according to the first embodiment.
Figure 3B:
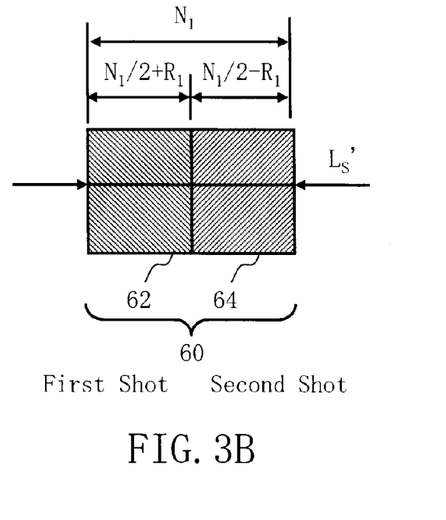

FIGS. 3A and 3B show examples of a reference pattern and an evaluation pattern for obtaining an optimum settling time in the case of a size change amount being small according to the first embodiment. FIG. 3A shows a reference pattern 50, and FIG. 3B shows an evaluation pattern 60.

In FIG. 3A, the reference pattern 50 is formed by a combination of adjacent two shots of the electron beam 200. The adjacent two shots of the electron beam 200 are shaped to patterns 52 and 54 having the same pattern width size of $N_1/2$ (an example of the first pattern width size). The pattern 52 is written as the first shot, and the pattern 54 is written as the second shot. Therefore, the reference pattern 50 is a pattern whose pattern width size is $N_1$ ($=N_1/2+N_1/2$). As to the reference pattern 50, since there is no size change between the first shot and the second shot of the beam to be shaped, it is not necessary perform beam displacement from the first shot to execute shaping deflection for the second shot.

In FIG. 3B, the evaluation pattern 60 is formed by a combination of adjacent two shots of electron beam 200. The first shot of the adjacent two shots of the electron beam 200 is shaped to a pattern 62 whose pattern width size is $N_1/2+R_1$ (an example of the second pattern width size) being displaced by a dimension $R_1$, which is less than the measurement limit of a measuring device, from $N_1/2$ (an example of the first pattern width size). The second shot is shaped to a pattern 64 whose pattern width size is $N_1/2−R_1$ (an example of the third pattern width size). Therefore, the evaluation pattern 60 is a pattern whose pattern width size after being resolved is $N_1$ ($=(N_1/2+R_1)+(N_1/2−R_1)$) which is the same in design as that of the reference pattern 50. As to the evaluation pattern 60, since size change occurs between the first shot and the second shot of the beam to be shaped, it becomes necessary to perform beam displacement by the amount $2R_1$ from the first shot to execute shaping deflection for the second shot. Therefore, a settling time for a beam deflection amount (displacement amount) of $2R_1$ is needed.

Since the dimension $R_1$ is less than the measurement limit of the measuring device, a pattern width size Ls of the reference pattern 50 to be practically measured after being resolved and a pattern width size Ls' of the evaluation pattern 60 to be practically measured after being resolved are thought to be the same dimension $N_1$ in design except for an error depending upon the settling time for beam shaping of the second shot of the evaluation pattern 60. Furthermore, since the shot orders of the reference pattern 50 and the evaluation pattern 60 are the same, position errors in connection with position deflection can be cancelled out. Even if deviation due to position deflection occurs in the reference pattern 50, since deviation due to position deflection also occurs similarly in the evaluation pattern 60, they can be cancelled out with each other.

For example, it is preferable to use, as the dimension $N_1$, the maximum shot size of the writing apparatus 100. However, it is not limited thereto. Any dimension is applicable as long as it can be measured by a measuring device. It is preferable for the dimension $R_1$ to satisfy $0<R_1 \leq 0.1 \cdot N_1$. When the dimension $R_1$ is 1 nm, for example, even if shaping gain deviation of 10% exists, since the size error is 0.2 nm, the influence on line width can be neglected.

Figure 4A:
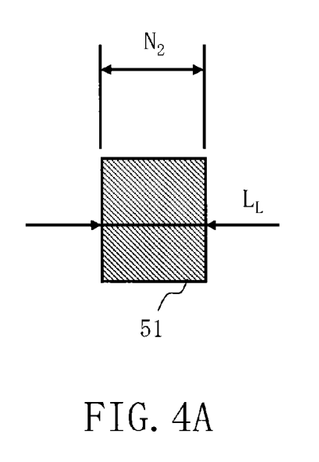
FIGS. 4A and 4B show examples of a reference pattern and an evaluation pattern for obtaining an optimum settling time in the case of a size change amount being large according to the first embodiment.
Figure 4B:
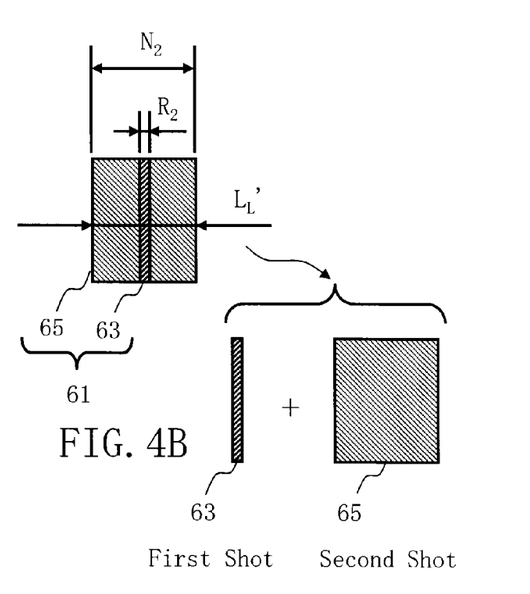

FIGS. 4A and 4B show examples of a reference pattern and an evaluation pattern for obtaining an optimum settling time in the case of a size change amount being large according to the first embodiment. FIG. 4A shows a reference pattern 51, and FIG. 4B shows an evaluation pattern 61.

In FIG. 4A, the reference pattern 51 is formed by one shot of the electron beam 200. The one shot of the electron beam 200 is shaped to the pattern 51 whose pattern width size is $N_2$ (another example of first pattern width size). Therefore, the pattern 51 is written by one shot.

In FIG. 4B, the evaluation pattern 61 is formed by overlapping two shots of electron beam 200. The first shot of the two shots of the electron beam 200 is shaped to a pattern 63 whose pattern width size is a dimension $R_2$ (another example of the second pattern width size) being less than the resolution limit of the electron beam 200. The second shot is shaped to a pattern 65 whose pattern width size is $N_2$ (another example of the third pattern width size) being the same as that of the reference pattern 51. The pattern 63 is written as the first shot. The pattern 65 is written as the second shot. Since the size $R_2$ of the pattern 63 is less than the resolution limit of the electron beam 200, the evaluation pattern 61 is a pattern whose pattern width size $N_2$ is the same in design as that of the reference pattern 51. If the pattern 63 is written such that it overlaps the end of the pattern 65, there is a possibility of affecting dimensions, as beam blur, even if it is less than the resolution limit. Therefore, in order to eliminate the influence on dimensions, it is preferable that the pattern 63 is written such that it overlaps the central part of the pattern 65. As to the evaluation pattern 61, since a size change occurs between the first shot and the second shot of the beam to be shaped, beam displacement by a dimension $(N_2-R_2)$ from the first shot needs to be performed for shaping deflection of the second shot. Therefore, a settling time for a beam deflection amount (displacement amount) of $(N_2-R_2)$ is needed.

Since the dimension $R_2$ is less than the resolution limit of the electron beam, a dimension $L_L$ of the reference pattern 51 to be practically measured and a dimension $L_L'$ of the evaluation pattern 61 to be practically measured are thought to be the same dimensions except for an error depending upon the settling time for beam shaping of the second shot of the evaluation pattern 61. Furthermore, as will be described later, position errors in connection with position deflection can be cancelled out by writing the reference pattern 51 and the evaluation pattern 61 at the same position in each writing target SF 30. Even if deviation (sub-deflection error) due to position deflection occurs in the reference pattern 51, since deviation due to position deflection also occurs similarly in the evaluation pattern 61, they can be cancelled out with each other.

For example, it is preferable to use, as the dimension $N_2$, the maximum shot size of the writing apparatus 100. However, it is not limited thereto. Any dimension is applicable as long as it can be measured by a measuring device. It is preferable for the dimension $R_2$ to be greater than zero and less than the resolution limit of the electron beam. For example, 1 nm is used as the dimension $R_2$.

Figure 5:
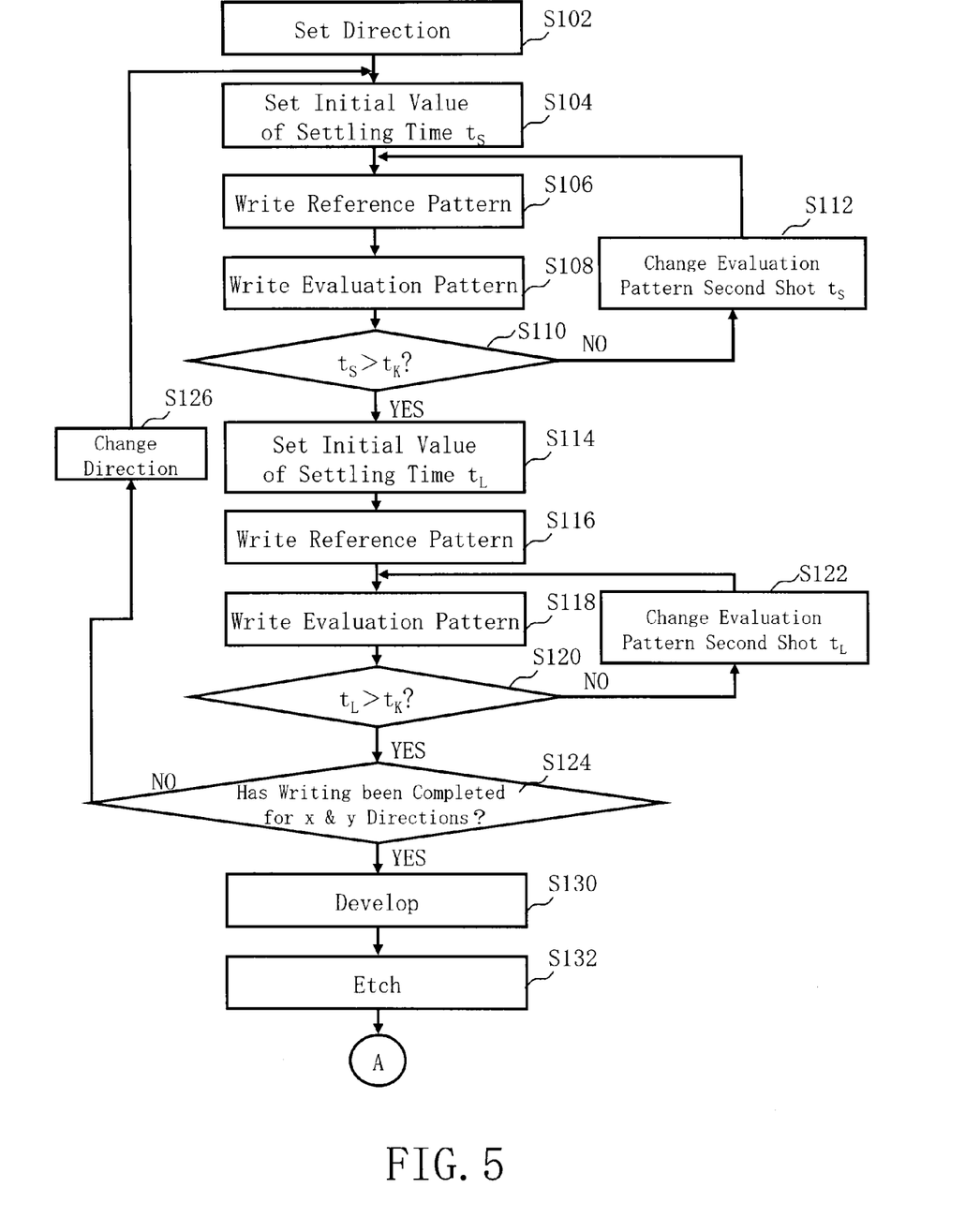
FIG. 5 is a flowchart showing main steps of a method of obtaining a settling time according to the first embodiment.
Figure 6:
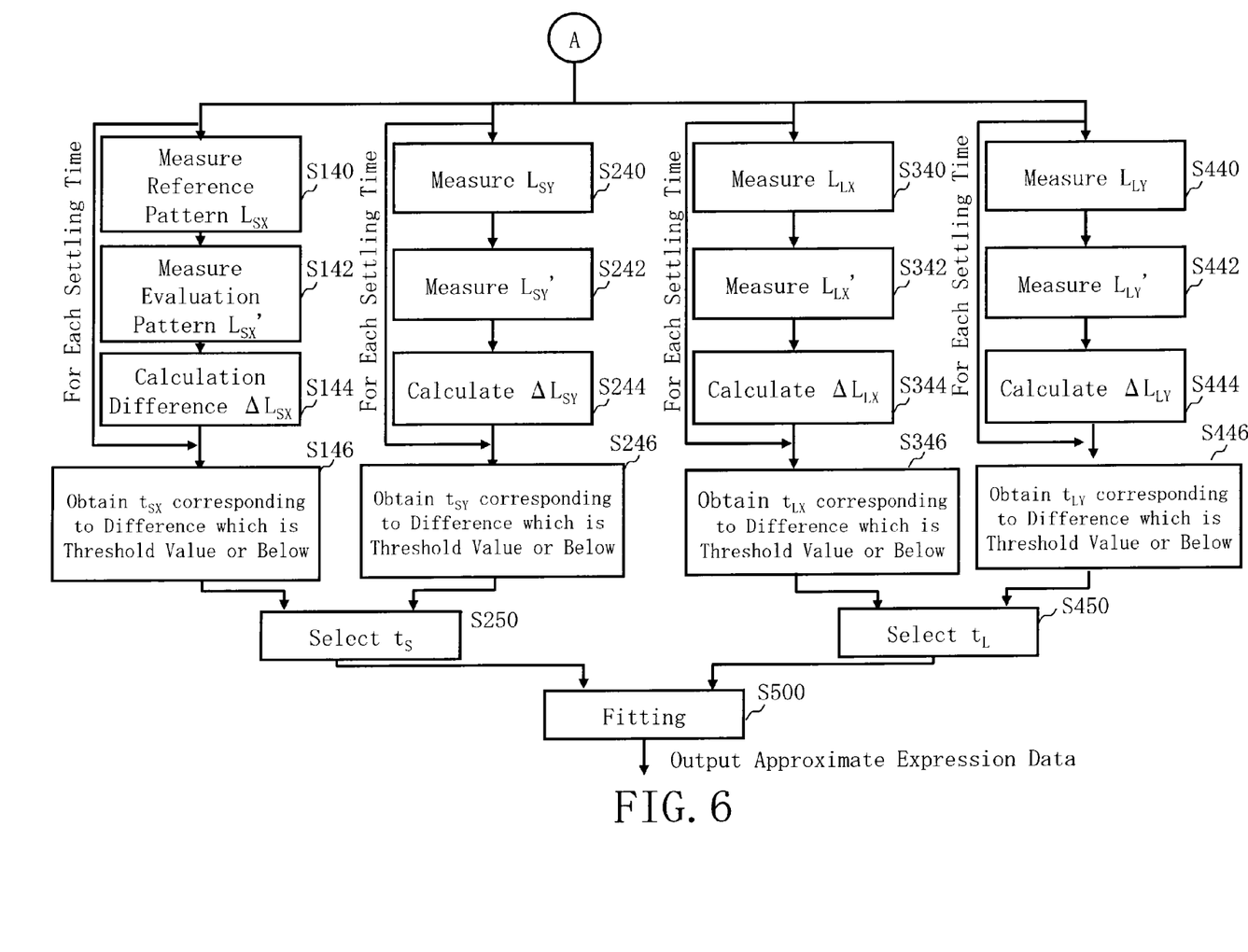
FIG. 6 is a flowchart showing the rest of the main steps of the method of obtaining a settling time according to the first embodiment.

FIG. 5 is a flowchart showing main steps of a method of obtaining a settling time according to the first embodiment. FIG. 6 is a flowchart showing the rest of the main steps of the method of obtaining a settling time according to the first embodiment. In the first embodiment, with respect to the X and Y directions, a settling time is obtained for a small amount of deflection (amount of displacement) (a short range) using the reference pattern 50 and the evaluation pattern 60 shown in FIGS. 3A and 3B, and a settling time is obtained for a large amount of deflection (amount of displacement) (a long range) using the reference pattern 51 and the evaluation pattern 61 shown in FIGS. 4A and 4B. It is also acceptable to obtain a settling time with respect to only one of the X direction and the Y direction.

In a direction setting step (S102), the writing control unit 116 sets either one of the X direction (the first direction) and the Y direction (the second direction) orthogonal to the X direction, as the direction of a pattern width being a measuring object. In this case, the X direction is set, for example.

In a settling time initial setting step (S104), the writing control unit 116 sets an initial value $(t_1)$ (first value) of a settling time $t_s$ of a short range. According to the first embodiment, the settling time of a short range with respect to shaping deflection of the pattern 52 of the first shot of the reference pattern 50 and shaping deflection of the pattern 62 of the first shot of the evaluation pattern 60 is set to be a sufficiently long time. Then, an initial value of the settling time $t_s$ is set with respect to shaping deflection of the pattern 64 of the second shot of the evaluation pattern 60.

In a reference pattern writing step (S106), one or more reference patterns 50 formed by two shots of the electron beam shaped by using the first shaping aperture 203, the second shaping aperture 206, and the deflector 205 are written on the target object 101.

In order to write the reference pattern 50, the writing data processing unit 114 reads reference pattern data for a short range from the storage device 140, and performs data conversion processing of a plurality of steps so as to generate apparatus specific shot data. In the reference pattern data, there is defined the reference pattern 50 shown in FIG. 3A. For practically performing writing, the writing data processing unit 114 generates the pattern 52 being a shot figure of the first shot and the pattern 54 being a shot figure of the second shot, wherein shot data is generated for each shot figure. In the shot data, there is defined figure data, such as a figure type, a figure size, and an irradiation position, for example. In addition, an irradiation time corresponding to a dose is also defined. The generated shot data is stored in the storage device 142.

Figure 7:
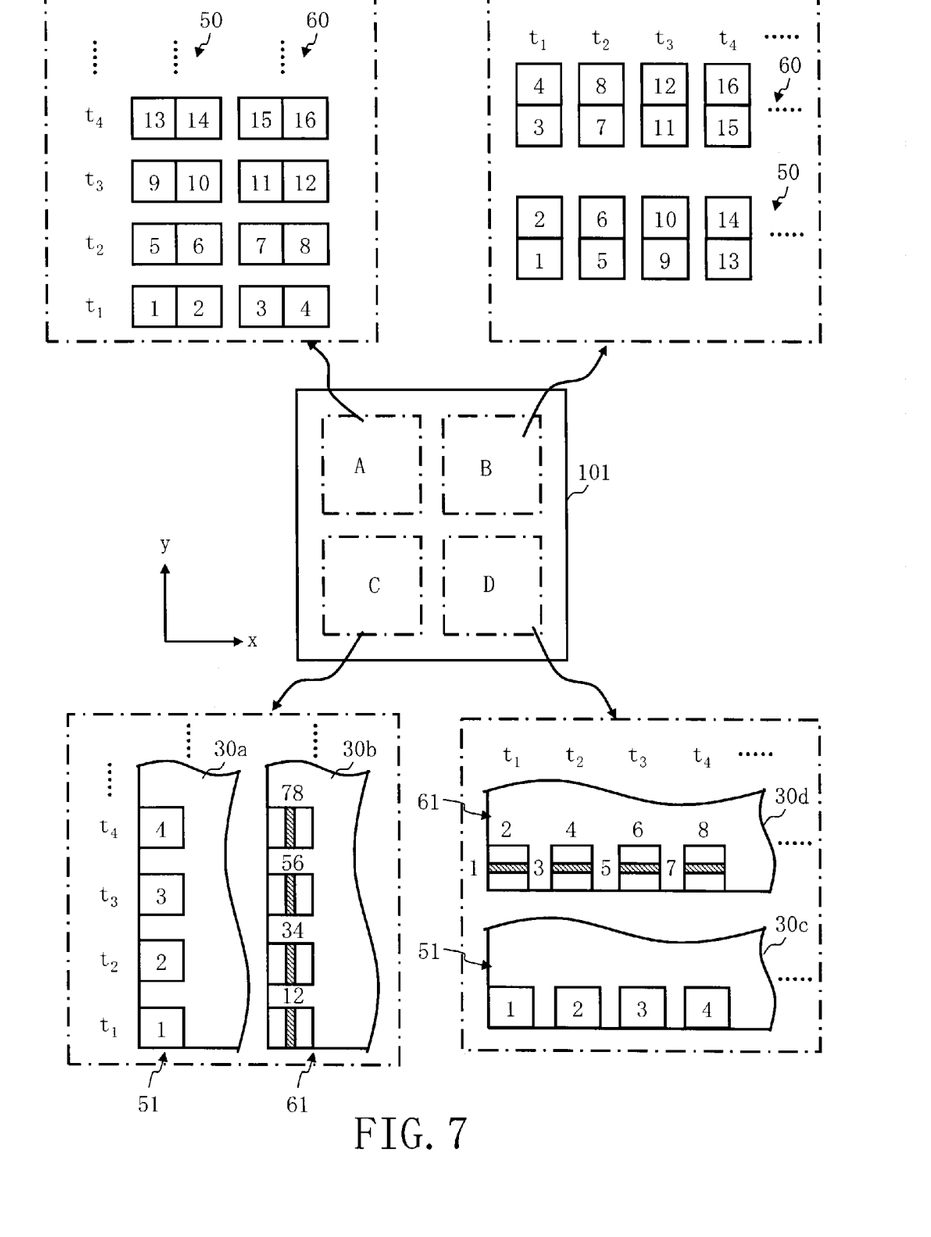
FIG. 7 shows an example of a writing region and a pattern arrangement according to the first embodiment.

FIG. 7 shows an example of a writing region and a pattern arrangement according to the first embodiment. In the reference pattern writing step (S106), the reference pattern 50 formed by two shots of the electron beam is written in a region A of the target object 101 shown in FIG. 7. Here, the patterns 52 and 54 are written according to the order of the numbers 1 to 2 at the positions indicated by the numbers 1 and 2.

In the deflection control circuit 120, shot data is read from the storage device 142. Then, based on shaping information defined in the shot data, shaping data is generated according to a figure type and a figure size, for each shot figure. The shaping data is output to the DAC amplifier 130. The deflection control circuit 120 generates blanking data, for each shot figure, according to an irradiation time defined in the shot data, and outputs it to the DAC amplifier for blanking (not shown). Moreover, the deflection control circuit 120 generates main deflection position data and sub-deflection position data according to position coordinates defined in the shot data, outputs the main deflection position data to a DAC amplifier for main position control (not shown), and outputs the sub-deflection position data to a DAC amplifier for sub position control (not shown). Based on signals from the control circuit 122 controlled by the writing control unit 116 and each DAC amplifier controlled by the deflection control circuit 120, the writing unit 150 writes a figure pattern concerned on the target object 100 with the electron beam 200. Specifically, it operates as follows.

The electron beam 200 emitted from the electron gun assembly 201 (an emission unit) is controlled by the blanking deflector 212 controlled by a deflection signal from the DAC amplifier for blanking when passing through the blanking deflector 212, to pass through the blanking aperture 214 when in the beam-on state, and to be deflected such that the entire beam is blocked by the blanking aperture 214 when in the beam-off state. The electron beam 200 that has passed through the blanking aperture 214 during the period from the beam-off state to the beam-on state and again changing to the beam-off state serves as one shot of the electron beam. The blanking deflector 212 controls the direction of the passing electron beam 200 to alternately generate the beam-on state and the beam-off state. For example, no voltage should be applied when in the beam-on state, and a voltage should be applied when in the beam-off state. The dose per shot of the electron beam 200 to irradiate the target object 101 is adjusted depending upon an irradiation time of each shot.

As described above, each shot of the electron beam 200, generated by passing through the blanking deflector 212 and the blanking aperture 214, irradiates the whole of the first shaping aperture 203 having a quadrangular opening by the illumination lens 202. Here, the electron beam 200 is first shaped to a quadrangle. Then, after having passed through the first shaping aperture 203, the electron beam 200 of the first aperture image is projected onto the second shaping aperture 206 by the projection lens 204. The first aperture image on the second shaping aperture 206 is deflection controlled by the deflector 205 so as to change (variably shape) the beam shape and the beam size. Such variable beam shaping is performed for each shot, and, usually, each shot is shaped to have a different shape and size when performing writing on an actual product target object. However, here, shaping is performed to a shot figure being a writing target in shot figures of the reference pattern and performed to a shot figure being a writing target in shot figures of the evaluation pattern. Then, after having passed through the second shaping aperture 206, the electron beam 200 of the second aperture image is focused by the objective lens 207, and deflected by the main deflector 208 and the sub deflector 209 to reach a desired position on the target object 101 placed on the XY stage 105. FIG. 1 shows the case of using multiple stage deflection of the main and sub deflection for position deflection. In such a case, what is to be done is to deflect the electron beam 200 of a shot concerned to a reference position in an SF 30 by the main deflector 208, and to deflect the beam of a shot concerned to each irradiation position in the SF by the sub deflector 209. A reference pattern or an evaluation pattern is written by repeating such operations and combining a shot figure of each shot.

In an evaluation pattern writing step (S108), the evaluation pattern 60, which is formed by two shots of the electron beam shaped by using the first shaping aperture 203, the second shaping aperture 206, and the deflector 205, is written on the target object 101 for each settling time while the settling time of the DAC amplifier 130 with respect to beam shaping of the second shot is being changed.

In order to write the evaluation pattern 60, the writing data processing unit 114 reads evaluation pattern data for a short range from the storage device 140, and performs data conversion processing of a plurality of steps so as to generate apparatus specific shot data. In the evaluation pattern data, there is defined the evaluation pattern 60 shown in FIG. 3B. For practically performing writing, the writing data processing unit 114 generates the pattern 62 being a shot figure of the first shot and the pattern 64 being a shot figure of the second shot, wherein shot data is generated for each shot figure. In the shot data, there is defined figure data, such as a figure type, a figure size, and an irradiation position, for example. In addition, an irradiation time corresponding to a dose is also defined. The generated shot data is stored in the storage device 142.

In the evaluation pattern writing step (S108), the evaluation pattern 60 formed by two shots of the electron beam is written in the region A of the target object 101 shown in FIG. 7. Here, the patterns 62 and 64 are written according to the order of numbers 3 to 4 at the positions indicated by numbers 3 and 4. The evaluation pattern 60 whose settling time of the second shot is $t_1$ is written at the position somewhat distanced in the X direction from the position of the written reference pattern 50. The distance should be away in the extent in which a pattern width can be measured.

In a determination step (S110), the writing control unit 116 determines whether a settling time $t_s$ of the second shot of the evaluation pattern 60 is greater than an allowed time $t_K$ or not. When the settling time $t_s$ is greater than the allowed time $t_K$, it proceeds to a settling time initial setting step (S114) for a long range. When the settling time $t_s$ is not greater than the allowed time $t_K$, it proceeds to a settling time change step (S112). Although the case of gradually increasing the settling time $t_s$ is shown in this case, it is also preferable to gradually decrease it. In such a case, what is necessary is that, in the determination step (S110), the writing control unit 116 determines whether the settling time $t_s$ of the second shot of the evaluation pattern 60 is smaller than the allowed time $t_K$ or not.

In the settling time change step (S112), the writing control unit 116 changes the settling time $t_s$ of the second shot of the evaluation pattern 60 to $t_2$ (second value) from $t_1$. Then, it returns to the reference pattern writing step (S106), and repeats each step from the reference pattern writing step (S106) to the settling time change step (S112) until the settling time $t_s$ of the second shot of the evaluation pattern 60 becomes greater than the allowed time $t_K$.

When repeating writing while changing the settling time $t_s$ of the second shot of the evaluation pattern 60, as shown in the region A of FIG. 7, the reference pattern 50 is written at the positions each shifted, for example, in the Y direction in order not to overlap the patterns having already been written. Similarly, the evaluation pattern 60 is written at the positions each shifted, for example, in the Y direction in order not to overlap the patterns having already been written. The numbers shown in the region A of FIG. 7 indicate the writing order of two shots of the reference pattern 50 and two shots of the evaluation pattern 60. The patterns 62 and 64 being two shots of the evaluation pattern 60 are repeatedly written always in the same shot order as that of the patterns 52 and 54 being two shots of the reference pattern 50. Therefore, position errors in connection with position deflection can be cancelled out.

In the settling time initial setting step (S114), the writing control unit 116 sets an initial value ($t_1$) (first value) of a settling time $t_L$ of a long range. According to the first embodiment, the settling time of a long range with respect to shaping deflection of the reference pattern 51 and shaping deflection of the pattern 63 of the first shot of the evaluation pattern 61 is set to be a sufficiently long time. Then, an initial value of the settling time $t_L$ is set with respect to shaping deflection of the pattern 65 of the second shot of the evaluation pattern 61.

In a reference pattern writing step (S116), one or more reference patterns 51 formed by one shot of the electron beam shaped by using the first shaping aperture 203, the second shaping aperture 206, and the deflector 205 are written on target object 101.

In order to write the reference pattern 51, the writing data processing unit 114 reads reference pattern data for a long range from the storage device 140, and performs data conversion processing of a plurality of steps so as to generate apparatus specific shot data. In the reference pattern data, there is defined the reference pattern 51 shown in FIG. 4A. For practically performing writing, the writing data processing unit 114 generates the pattern 51 being a shot figure of one shot, and generates shot data. In the shot data, there is defined figure data, such as a figure type, a figure size, and an irradiation position, for example. In addition, an irradiation time corresponding to a dose is also defined. The generated shot data is stored in the storage device 142.

In the reference pattern writing step (S116), the reference pattern 51 formed by one shot of the electron beam is written in a region C of the target object 101 shown in FIG. 7. Here, the reference pattern 51 is written according to the numerical order at the positions indicated by the numbers 1, 2 and so on. The reference pattern 51 is repeatedly written, in a certain SF 30a, at the positions each shifted, for example, in the Y direction in order not to overlap the patterns having already been written.

In an evaluation pattern writing step (S118), the evaluation pattern 61, which is formed by two shots of the electron beam shaped by using the first shaping aperture 203, the second shaping aperture 206, and the deflector 205, is written on the target object 101 for each settling time while the settling time of the DAC amplifier 130 with respect to beam shaping of the second shot is being changed.

In order to write the evaluation pattern 61, the writing data processing unit 114 reads evaluation pattern data for a long range from the storage device 140, and performs data conversion processing of a plurality of steps so as to generate apparatus specific shot data. In the evaluation pattern data, there is defined the evaluation pattern 61 shown in FIG. 4B. For practically performing writing, the writing data processing unit 114 generates the pattern 63 being a shot figure of the first shot and the pattern 65 being a shot figure of the second shot, wherein shot data is generated for each shot figure. In the shot data, there is defined figure data, such as a figure type, a figure size, and an irradiation position, for example. In addition, an irradiation time corresponding to a dose is also defined. The generated shot data is stored in the storage device 142.

In the evaluation pattern writing step (S118), the evaluation pattern 61 formed by two shots of the electron beam is written in the region C of the target object 101 shown in FIG. 7. Here, the patterns 63 and 65 are written according to the numerical order at the positions indicated by the numbers 1, 2 and so on. The evaluation pattern 61 whose settling time of the second shot is $t_1$ is written, in an SF 30b, at the same position as that where a corresponding reference pattern 51 is written in the SF 30a differing from the SF 30b. In other words, a corresponding reference pattern 51 has been written with respect to each settling time of the second shot of the evaluation pattern 61. By making the writing positions of the reference pattern 51 and the evaluation pattern 61 coincident in the SFs 30, a sub-deflection error can be cancelled out when measuring the line width.

In a determination step (S120), the writing control unit 116 determines whether a settling time $t_L$ of the second shot of the evaluation pattern 61 is greater than the allowed time $t_K$ or not. When the settling time $t_L$ is greater than the allowed time $t_K$, it proceeds to a development step (S130). When the settling time $t_L$ is not greater than the allowed time $t_K$, it proceeds to a settling time change step (S122). Although the case of gradually increasing the settling time $t_L$ is shown in this case, it is also preferable to gradually decrease it. In such a case, what is necessary is that, in the determination step (S120), the writing control unit 116 determines whether the settling time $t_L$ of the second shot of the evaluation pattern 61 is smaller than the allowed time $t_K$ or not.

In the settling time change step (S122), the writing control unit 116 changes the settling time $t_L$ of the second shot of the evaluation pattern 61 to $t_2$ (second value) from $t_1$. Then, it returns to the evaluation pattern writing step (S118), and repeats each step from the evaluation pattern writing step (S118) to the settling time change step (S122) until the settling time $t_L$ of the second shot of the evaluation pattern 61 becomes greater than the allowed time $t_K$.

As described above, one or more reference patterns 50 of a short range and one or more reference patterns 51 of a long range, each of which is formed by at least one shot of the electron beam 200, where the direction of a pattern width to be measured is the X direction, are written on the target object. Besides, the evaluation pattern 60 of a short range, which is formed by a combination of two shots of the electron beam having been shaped to two patterns of different sizes and whose pattern width size after being resolved is the same in design as that of the reference pattern 50, is written on the target object for each settling time while the settling time with respect to beam shaping of the second shot is being changed. Furthermore, the evaluation pattern 61 of a long range, which is formed by a combination of two shots of the electron beam having been shaped to two patterns of different sizes and whose pattern width size after being resolved is the same in design as that of the reference pattern 51, is written on the target object for each settling time while the settling time with respect to beam shaping of the second shot is being changed.

In a determination step (S124), the writing control unit 116 determines whether writing has been completed with respect to both the X and Y directions. When writing has been completed with respect to both the X and Y directions, it proceeds to the development step (S130). When writing has not been completed with respect to either the X direction or the Y direction, it proceeds to a direction change step (S126).

In the direction change step (S126), the writing control unit 116 sets either one of the X direction (the first direction) and the Y direction (the second direction), as the direction of a pattern width to be measured. In this case, the direction is changed to the Y direction, for example. Then, it returns to the settling time initial setting step (S104), and repeats each step from the settling time initial setting step (S104) to the determination step (S124).

In the case that the direction of the pattern width being a measuring object is the Y direction, the directions of the reference patterns 50 and 51, and the evaluation patterns 60 and 61 are rotated by 90 degrees from the case of the X direction. Then, in the case of a short range, as shown in the region B of FIG. 7, the reference pattern 50 and the evaluation pattern 60 are written such that the first shot and the second shot align in the Y direction. When repeating writing while changing the settling time $t_s$ of the second shot of the evaluation pattern 60, as shown in the region B of FIG. 7, the reference pattern 50 is written at the positions each shifted, for example, in the X direction in order not to overlap the patterns having already been written. Similarly, the evaluation pattern 60 is written at the positions each shifted, for example, in the X direction in order not to overlap the patterns having already been written. The numbers shown in the region B of FIG. 7 indicate the writing order of two shots of the reference pattern 50 and two shots of the evaluation pattern 60. The patterns 62 and 64 being two shots of the evaluation pattern 60 are repeatedly written always in the same shot order as that of the patterns 52 and 54 being two shots of the reference pattern 50. Therefore, position errors in connection with position deflection can be cancelled out.

In the case of a long range, the reference pattern 51 formed by one shot of the electron beam is written in the region D of the target object 101 shown in FIG. 7. Here, the reference pattern 51 is written according to the numerical order at the positions indicated by the numbers 1, 2 and so on. The reference pattern 51 is repeatedly written, in a certain SF 30c, at the positions each shifted, for example, in the X direction in order not to overlap the patterns having already been written. Moreover, the evaluation pattern 61 formed by two shots of the electron beam is also written in the region D of the target object 101 shown in FIG. 7. Here, the patterns 63 and 65 are written according to the numerical order at the positions indicated by the numbers 1, 2 and so on. The evaluation pattern 61 whose settling time of the second shot is $t_1$ is written, in an SF 30d, at the same position as that where a corresponding reference pattern 51 is written in the SF 30c differing from the SF 30d. In other words, a corresponding reference pattern 51 has been written with respect to each settling time of the second shot of the evaluation pattern 61. By making the writing positions of the reference pattern 51 and the evaluation pattern 61 coincident in the SFs 30, a sub-deflection error can be cancelled out when measuring the line width.

As described above, one or more reference patterns 50 of a short range and one or more reference patterns 51 of a long range, each of which is formed by at least one shot of the electron beam 200, where the direction of a pattern width to be measured is the Y direction, are written on the target object. Besides, the evaluation pattern 60 of a short range, which is formed by a combination of two shots of the electron beam having been shaped to two patterns of different sizes and whose pattern width size after being resolved is the same in design as that of the reference pattern 50, is written on the target object for each settling time while the settling time with respect to beam shaping of the second shot is being changed. Furthermore, the evaluation pattern 61 of a long range, which is formed by a combination of two shots of the electron beam having been shaped to two patterns of different sizes and whose pattern width size after being resolved is the same in design as that of the reference pattern 51, is written on the target object for each settling time while the settling time with respect to beam shaping of the second shot is being changed.

In the development step (S130), the written target object 101 is developed.

In an etching step (S132), an exposed light-shielding film is etched by using an developed resist pattern as a mask. Needless to say, the resist pattern is removed by means of ashing, etc. after the etching. Thereby, the target object 101 on which patterns are formed by the light-shielding film is produced.

In a reference pattern measurement step (S140), a pattern width size $L_{sx}$ in the X direction of the reference pattern 50 of a short range is measured using a measuring device.

In an evaluation pattern measurement step (S142), a pattern width size $L_{sx}'$ in the X direction of the evaluation pattern 60 of a short range is measured using a measuring device.

In a difference calculation step (S144), the difference $\Delta L_{sx}$ between the pattern width size $L_{sx}$ of the reference pattern 50 and the pattern width size $L_{sx}'$ of the evaluation pattern 60 in the measured settling time $t_s$ is calculated.

Each step from the reference pattern measurement step (S140) to the difference calculation step (S144) is repeated for each settling time $t_s$. Thereby, the difference $\Delta L_{sx}$ between the pattern width size $L_{sx}$ of the reference pattern 50 and the pattern width size $L_{sx}'$ of the evaluation pattern 60 for each settling time $t_s$ is obtained.

In a settling time acquisition step (S146), in regard to differences $\Delta L_{sx}$ each being for each settling time $t_s$, a settling time $t_s$ of the DAC amplifier 130 with respect to which the difference $\Delta L_{sx}$ is less than or equal to a threshold value is obtained.

In a reference pattern measurement step (S240), a pattern width size Lsy in the Y direction of the reference pattern 50 of a short range is measured using a measuring device.

In an evaluation pattern measurement step (S242), a pattern width size Lsy' in the Y direction of the evaluation pattern 60 of a short range is measured using a measuring device.

In a difference calculation step (S244), the difference ΔLsy between the pattern width size Lsy of the reference pattern 50 and the pattern width size Lsy' of the evaluation pattern 60 in the measured settling time $t_s$ is calculated.

Each step from the reference pattern measurement step (S240) to the difference calculation step (S244) is repeated for each settling time $t_s$. Thereby, the difference ΔLsy between the pattern width size Lsy of the reference pattern 50 and the pattern width size Lsy' of the evaluation pattern 60 is obtained for each settling time $t_s$.

In a settling time acquisition step (S246), in regard to differences ΔLs each being for each settling time $t_s$, a settling time $t_s$ of the DAC amplifier 130 with respect to which the difference ΔLsy is less than or equal to a threshold value is obtained.

In a reference pattern measurement step (S340), a pattern width size $L_{LX}$ in the X direction of the reference pattern 51 of a long range is measured using a measuring device.

In an evaluation pattern measurement step (S342), a pattern width size $L_{LX}'$ in the X direction of the evaluation pattern 61 of a long range is measured using a measuring device.

In a difference calculation step (S344), the difference $\Delta L_{LX}$ between the pattern width size $L_{LX}$ of the reference pattern 51 and the pattern width size $L_{LX}'$ of the evaluation pattern 61 in the measured settling time $t_L$ is calculated.

Each step from the reference pattern measurement step (S340) to the difference calculation step (S344) is repeated for each settling time $t_L$. Thereby, the difference $\Delta L_{LX}$ between the pattern width size $L_{LX}$ of the reference pattern 51 and the pattern width size $L_{LX}'$ of the evaluation pattern 61 is obtained for each settling time $t_L$.

In a settling time acquisition step (S346), in regard to differences $\Delta L_{LX}$ each being for each settling time $t_L$, a settling time $t_L$ of the DAC amplifier 130 with respect to which the difference $\Delta L_{LX}$ is less than or equal to a threshold value is obtained.

In a reference pattern measurement step (S440), a pattern width size $L_{LY}$ in the Y direction of the reference pattern 51 of a long range is measured using a measuring device.

In an evaluation pattern measurement step (S442), a pattern width size $L_{LY}'$ in the Y direction of the evaluation pattern 61 of a long range is measured using a measuring device.

In a difference calculation step (S444), the difference $\Delta L_{LY}$ between the pattern width size $L_{LY}$ of the reference pattern 51 and the pattern width size $L_{LY}'$ of the evaluation pattern 61 in the measured settling time $t_L$ is calculated.

Each step from the reference pattern measurement step (S440) to the difference calculation step (S444) is repeated for each settling time $t_L$. Thereby, the difference $\Delta L_{LY}$ between the pattern width size $L_{LY}$ of the reference pattern 51 and the pattern width size $L_{LY}'$ of the evaluation pattern 61 is obtained for each settling time $t_L$.

In a settling time acquisition step (S446), in regard to differences $\Delta L_{LY}$ each being for each settling time $t_L$, a settling time $t_L$ of the DAC amplifier 130 with respect to which the difference $\Delta L_{LY}$ is less than or equal to a threshold value is obtained.

Figure 8:
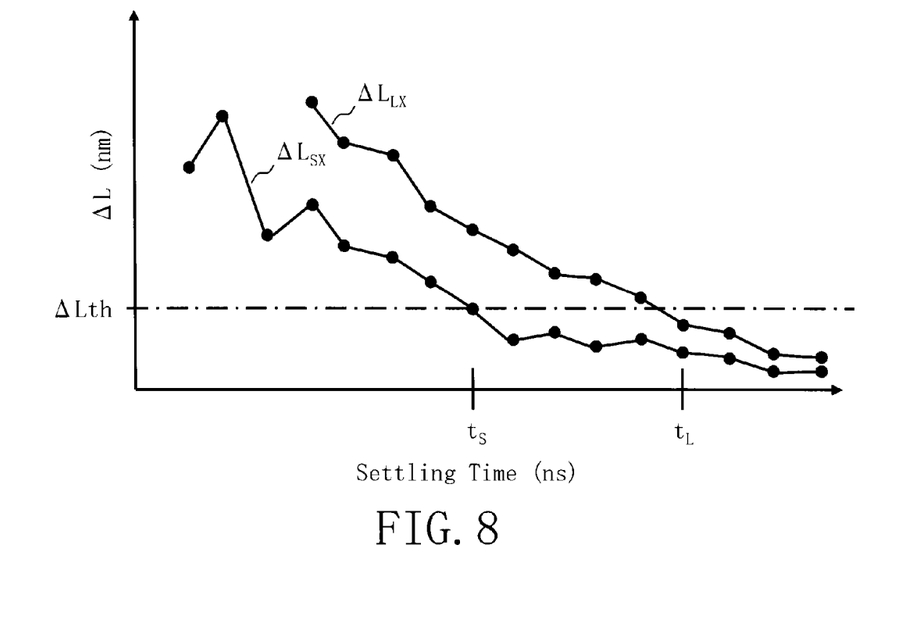
FIG. 8 is an example of a graph showing a relation between a difference and a settling time according to the first embodiment.

FIG. 8 is an example of a graph showing a relation between a difference and a settling time according to the first embodiment. In FIG. 8, the ordinate axis shows a difference and the abscissa axis shows a settling time. For example, with respect to a pattern width size in the X direction, a difference $\Delta L_{sx}$ of a short range and a difference $\Delta L_{Lx}$ of a long range are shown for each settling time in FIG. 8. It should be understood a graph (not shown) that denotes a relation between a difference and a settling time can also be obtained with respect to a pattern width size in the Y direction. If a settling time is increased, the difference $\Delta L_{sx}$ of a short range gradually becomes small. Similarly, a difference $\Delta L_{Lx}$ of a long range gradually becomes small. Then, both of them become less than a threshold value $\Delta L$th. Since the amount of displacement of a long range is larger than that of a short range, a long settling time becomes needed. Therefore, as shown in FIG. 8, compared to the case of the difference $\Delta L_{sx}$ of a short range, the settling time until the difference $\Delta L_{Lx}$ of a long range becomes below the threshold value $\Delta L$th takes a long time.

As described above, the settling time $t_s$ of the X-direction width of a short range, the settling time $t_s$ of the Y-direction width of a short range, the settling time $t_L$ of the X-direction width of a long range, and the settling time $t_L$ of the Y-direction width of a long range can be obtained.

As described above, according to the first embodiment, a suitable settling time of a short range ($2R_1$ displacement) in shaping deflection of changing a figure size can be obtained. Similarly, according to the first embodiment, a suitable settling time of a long range ($N_2$-$R_2$ displacement) in shaping deflection of changing a figure size can also be obtained.

In the first embodiment, a settling time unified in accordance with a size is set with respect to a size change in the X direction and the Y direction. Therefore, one of the settling time $t_s$ of the X-direction width of a short range and the settling time $t_s$ of the Y-direction width of a short range is selected. Similarly, one of the settling time $t_L$ of the X-direction width of a long range and the settling time $t_L$ of the Y-direction width of a long range is selected.

In a settling time $t_s$ selection step (S250), the longer one is selected from the settling time $t_s$ of the X-direction width of a short range and the settling time $t_s$ of the Y-direction width of a short range. Thereby, figure errors resulting from the settling time $t_s$ can be eliminated.

In a settling time $t_L$ selection step (3450), the longer one is selected from the settling time $t_L$ of the X-direction width of a long range and the settling time $t_L$ of the Y-direction width of a long range. Thereby, figure errors resulting from the settling time $t_L$ can be eliminated.

In a fitting step (S500), a relational expression of a settling time and a deflection amount (a size movement) is obtained by fitting (approximating) acquired settling time $t_s$ of a short range and settling time $t_L$ of a long range.

Figure 9:
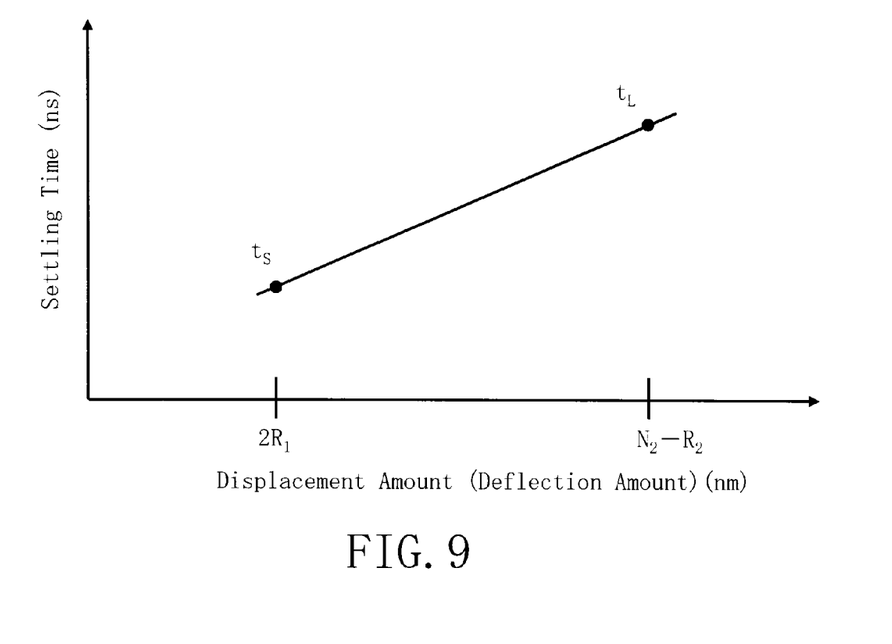
FIG. 9 is an example of a graph showing a relation between a settling time and a deflection amount (a size movement) according to the first embodiment.

FIG. 9 is an example of a graph showing a relation between a settling time and a deflection amount (a size movement) according to the first embodiment. In FIG. 9, the ordinate axis shows a settling time and the abscissa axis shows a deflection amount (a size movement). A function expression of a primary proportion concerning the settling time $t_s$ of a short range of a small size movement and the settling time $t_L$ of a long range of a large size movement, connected with a straight line, is calculated. Then, an obtained relational expression and coefficients of the relational expression are set in the deflection control circuit 120. Thereby, when writing an actual product, a settling time in accordance with a size movement in changing the size can be obtained for each shot.

According to the first embodiment, as described above, it is possible to obtain a suitable settling time in shaping deflection of changing a figure size. Moreover, it is possible to reduce a writing time by varying, for each shot, the settling time of shaping deflection.

Referring to specific examples, the embodiment has been described above. However, the present invention is not limited to these examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus, charged particle beam writing method, and settling time acquisition method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A settling time acquisition method comprising:
   writing, on a target object, at least one reference pattern formed by at least one shot of a charged particle beam having been shaped by using a first shaping aperture, a second shaping aperture, and a deflector for deflecting the charged particle beam passing between the first shaping aperture and the second shaping aperture;
   writing, on the target object, an evaluation pattern, which has been formed by a combination of two shots of a first shot and a second shot of a charged particle beam having been shaped to a first pattern and a second pattern of different sizes by using the first shaping aperture, the second shaping aperture, and the deflector, and whose pattern width size after being resolved is a same in design as that of the reference pattern, while changing, with respect to beam shaping of the second shot, a settling time of a DAC (digital/analogue converter) amplifier for controlling the deflector, wherein the writing is performed for each of the settling time;
   measuring a pattern width size of the reference pattern;
   measuring the pattern width size of the evaluation pattern for the each of the settling time;
   calculating, for the each of the settling time, a difference between the pattern width size of the reference pattern and the pattern width size of the evaluation pattern; and
   acquiring a settling time from the each of the settling time of the DAC amplifier in a case where the difference is less than or equal to a threshold value.

2. The method according to claim 1, wherein
   the reference pattern whose direction of a pattern width being a measuring object is a first direction and the reference pattern whose direction of a pattern width being a measuring object is a second direction orthogonal to the first direction are respectively written,
   the evaluation pattern whose direction of a pattern width being a measuring object is the first direction and the evaluation pattern whose direction of a pattern width being a measuring object is the second direction are respectively written for the each of the settling time,
   the pattern width size of the reference pattern is measured with respect to the first direction and the second direction,
   the pattern width size of the evaluation pattern for the each of the settling time is measured with respect to the first direction and the second direction,
   the difference is calculated for the each of the settling time, with respect to the first direction and the second direction, and the each of the settling time of the DAC amplifier is acquired with respect to the first direction and the second direction, further comprising:

selecting a longer one of the each of the settling time of the DAC amplifier acquired with respect to the first direction and the each of the settling time of the DAC amplifier acquired with respect to the second direction.

3. The method according to claim 1, wherein the reference pattern is formed by a combination of adjacent two shots of the charged particle beam having been shaped to patterns of a same first pattern width size, and the evaluation pattern is formed by a combination of the two shots being adjacent to each other of the charged particle beam having been shaped to patterns of a second pattern width size and a third pattern width size, wherein the second pattern width size is displaced to be longer than the first pattern width size by a dimension less than a measurement limit of a measuring device and the third pattern width size is displaced to be shorter than the first pattern width size by the dimension less than the measurement limit of the measuring device.

4. The method according to claim 1, wherein the reference pattern is formed by one shot of a charged particle beam having been shaped to a pattern of a first pattern width size, and the evaluation pattern is formed by overlapping a first shot of a charged particle beam having been shaped to a pattern of a second pattern width size less than a resolution limit and a second shot of a charged particle beam having been shaped to a pattern of the first pattern width size.

5. The method according to claim 1, further comprising:

setting one of a first direction and a second direction orthogonal to the first direction, as a direction of a pattern width being a measuring object.

6. The method according to claim 5, further comprising:

setting a first value of the settling time of beam shaping of the second shot of the evaluation pattern.

7. The method according to claim 6, wherein the reference pattern, whose direction of a pattern width being a measuring object is the first direction, is written by a combination of two shots of a charged particle beam of a same size and aligning in the first direction, and the evaluation pattern, whose direction of a pattern width being the measuring object is the first direction, is written in a state where the settling time of the DAC amplifier for controlling the deflector, with respect to beam shaping of the second shot of the evaluation pattern is the first value.

8. The method according to claim 7, further comprising:

changing, after the evaluation pattern has been written in a state where the settling time of beam shaping of the second shot of the evaluation pattern is set to the first value, the first value of the settling time of beam shaping of the second shot of the evaluation pattern to a second value.

9. The method according to claim 7, wherein a settling time of beam shaping of a first shot of the reference pattern and a settling time of beam shaping of the first shot of the evaluation pattern are set to values sufficiently greater than the first value.

10. A settling time acquisition method comprising:

writing, on a target object, at least one reference pattern formed by one shot of a charged particle beam having been shaped to a pattern of a first pattern width size by using a first shaping aperture, a second shaping aperture, and a deflector for deflecting a charged particle beam passing between the first shaping aperture and the second shaping aperture;

writing, on the target object, an evaluation pattern which has been formed by overlapping a first shot of a charged particle beam having been shaped to a pattern of a second pattern width size less than a resolution limit and a second shot of a charged particle beam having been shaped to a pattern of the first pattern width size by using the first shaping aperture, the second shaping aperture, and the deflector while changing, with respect to beam shaping of the second shot, a settling time of a DAC (digital/analogue converter) amplifier for controlling the deflector, wherein the writing is performed for each of the settling time;

measuring a pattern width size of the reference pattern;

measuring a pattern width size of the evaluation pattern for the each of the settling time;

calculating, for the each of the settling time, a difference between the pattern width size of the reference pattern and the pattern width size of the evaluation pattern; and acquiring a settling time from the each of the settling time of the DAC amplifier in a case where the difference is less than or equal to a threshold value.

* * * * *